(12) United States Patent
Yang et al.

(10) Patent No.: US 12,400,930 B2
(45) Date of Patent: Aug. 26, 2025

(54) POWER MODULE PACKAGE

(71) Applicant: NIKO SEMICONDUCTOR CO., LTD., New Taipei (TW)

(72) Inventors: Hui-Chiang Yang, Taipei Hsien (TW); Chung-Ming Leng, New Taipei (TW); Chih-Cheng Hsieh, Taoyuan (TW); Wei-Lun Wang, New Taipei (TW)

(73) Assignee: NIKO SEMICONDUCTOR CO., LTD., New Taipei (TW)

( * ) Notice: Subject to any disclaimer, the term of this patent is extended or adjusted under 35 U.S.C. 154(b) by 442 days.

(21) Appl. No.: 18/069,944

(22) Filed: Dec. 21, 2022

(65) Prior Publication Data

US 2023/0369163 A1 Nov. 16, 2023

(30) Foreign Application Priority Data

May 10, 2022 (TW) .................................. 111117392

(51) Int. Cl.
| | |
|---|---|
| *H01L 23/373* | (2006.01) |
| *H01L 23/498* | (2006.01) |
| *H01L 23/538* | (2006.01) |
| *H01L 25/07* | (2006.01) |
| *H01L 23/00* | (2006.01) |

(52) U.S. Cl.
CPC .... *H01L 23/3735* (2013.01); *H01L 23/49811* (2013.01); *H01L 23/5386* (2013.01); *H01L 25/072* (2013.01); *H01L 24/40* (2013.01); *H01L 2224/40227* (2013.01)

(58) Field of Classification Search
CPC ........... H01L 23/3735; H01L 23/49811; H01L 23/5386; H01L 25/072; H01L 24/40; H01L 2224/40227
See application file for complete search history.

(56) References Cited

U.S. PATENT DOCUMENTS

| | | | |
|---|---|---|---|
| 2010/0127383 A1* | 5/2010 | Oka ........................ | H01L 24/40 257/692 |
| 2015/0287665 A1* | 10/2015 | Hanada ................... | H01L 25/07 257/691 |
| 2017/0256473 A1 | 9/2017 | Hsieh | |
| 2019/0385985 A1* | 12/2019 | Tsuchimochi .... | H01L 23/49575 |
| 2020/0203253 A1* | 6/2020 | Sakakibara ......... | H01L 21/4882 |
| 2021/0057324 A1 | 2/2021 | Leng et al. | |
| 2022/0115302 A1 | 4/2022 | Fukatsu et al. | |

FOREIGN PATENT DOCUMENTS

| | | |
|---|---|---|
| TW | 201732968 A | 9/2017 |
| TW | 202110289 A | 3/2021 |

* cited by examiner

*Primary Examiner* — Peniel M Gumedzoe (74) *Attorney, Agent, or Firm* — Li & Cai Intellectual Property Office (57) ABSTRACT

A power module package is provided. The power module package includes an electronic assembly that includes a substrate and a power device group. The substrate includes an insulating layer, a circuit pattern layer, and a conductive heat-dissipating layer. The circuit pattern layer and the conductive heat-dissipating layer are respectively disposed at two opposite sides of the insulating layer. The power device group is disposed on the circuit pattern layer, and the power device group and the circuit pattern layer are configured to form a common circuit. A total area of the conductive heat-dissipating layer is greater than that of the circuit pattern layer, and a thickness of the circuit pattern layer is greater than that of the insulating layer.

10 Claims, 7 Drawing Sheets

POWER MODULE PACKAGE

CROSS-REFERENCE TO RELATED PATENT APPLICATION

This application claims the benefit of priority to Taiwan Patent Application No. 111117392, filed on May 10, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power module package, and more particularly to a power module package with high withstand voltage.

BACKGROUND OF THE DISCLOSURE

Power devices can be used in home frequency conversion systems, electric vehicles, and industrial control systems to convert electrical energy or control circuits. In the related art, the power devices, the gate driving components and the control components are usually integrated in the circuit system. Accordingly, in the related art, according to the circuit design, after a specific circuit layout is formed on the circuit board in advance, a plurality of discrete power chips, control chips, gate drive chips and other components are assembled on the main control circuit board and packaged together to form a power module.

In some circuits, such as voltage conversion circuits, power modules need to operate under a condition of high voltage or high current. Therefore, in order to allow a large current to pass through, a larger lead frame and a wire bonding packaging technology are used for a packaging process. As a result, the size of the power module is relatively large and it is difficult to be reduced. In addition, the power module generates a lot of heat during operation, so that the power module is also needed to have a good heat dissipation capability.

SUMMARY OF THE DISCLOSURE

In response to the above-referenced technical inadequacies, the present disclosure provides a power module package that can not only operate at high voltage or high current, but also have a small volume and a good heat dissipation capability.

In one aspect, the present disclosure provides a power module package, which includes an electronic assembly, and the electronic assembly includes a substrate and a power device group. The substrate includes an insulating layer, a circuit pattern layer and a conductive heat-dissipating layer, and the conductive heat-dissipating layer and the circuit pattern layer are respectively located on two opposite sides of the insulating layer. The power device group is disposed on the circuit pattern layer, and the power device group and the circuit pattern layer are configured to form a common circuit. A total area of the conductive heat-dissipating layer is greater than a total area of the circuit pattern layer, and a thickness of the circuit pattern layer is greater than a thickness of the insulating layer.

One of the beneficial effects of the present disclosure is that the power module packages provided by the present disclosure can reduce the volume of the power module packages, and can enable the power module packages to have a higher operating voltage by virtue of the substrate including the insulating layer, the circuit pattern layer and the conductive heat-dissipating layer, the power device group being arranged on the circuit pattern layer to form the common circuit, the total area of the conductive heat-dissipating layer being greater than the total area of the circuit pattern layer, and the thickness of the circuit pattern layer being greater than the thickness of the insulating layer. In addition, the conductive heat-dissipating layer of the substrate can also be used to dissipate the heat generated from the power module packages.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

EMBODIMENTS

Figure 1:
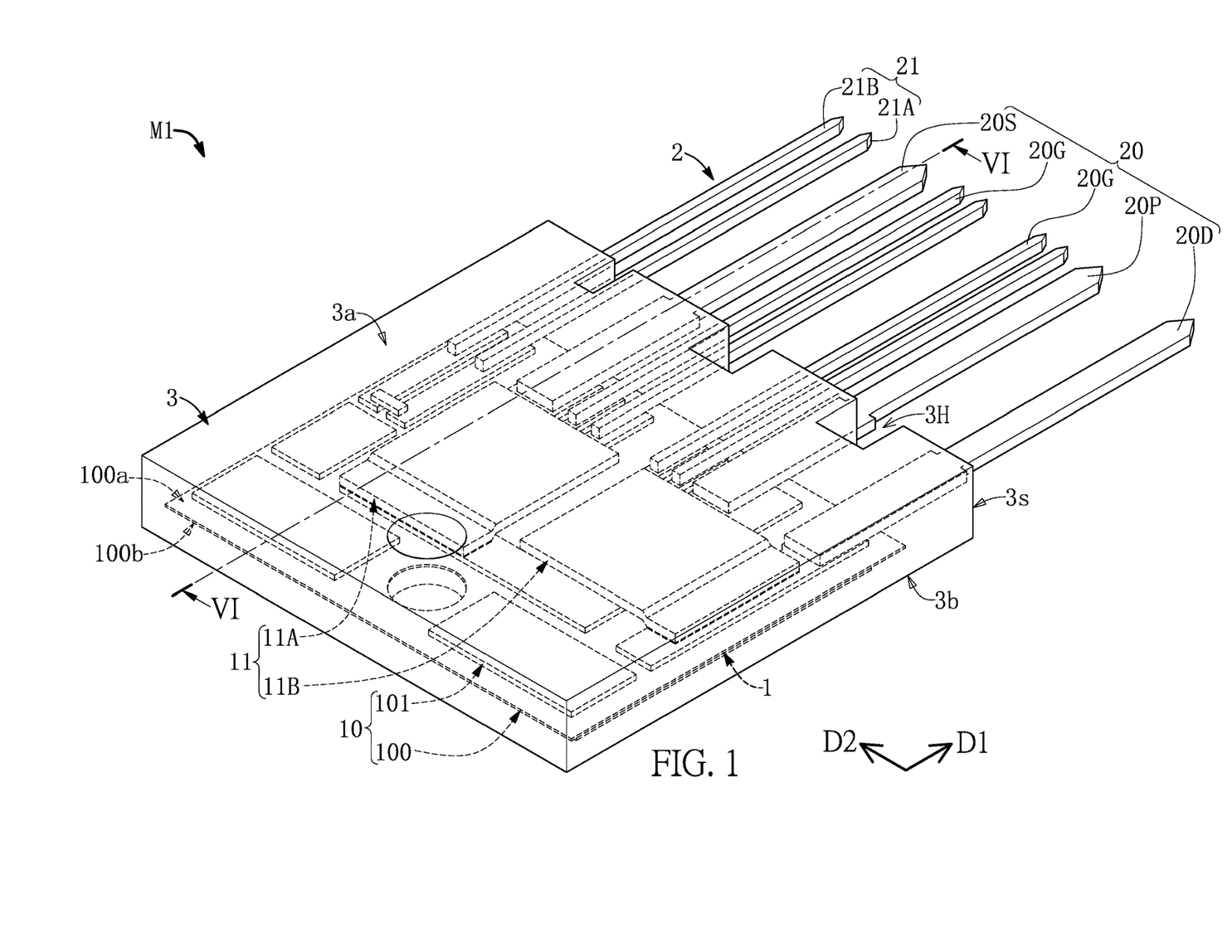
FIG. 1 is a schematic perspective view of a power module package according to a first embodiment of the present disclosure.
Figure 2:
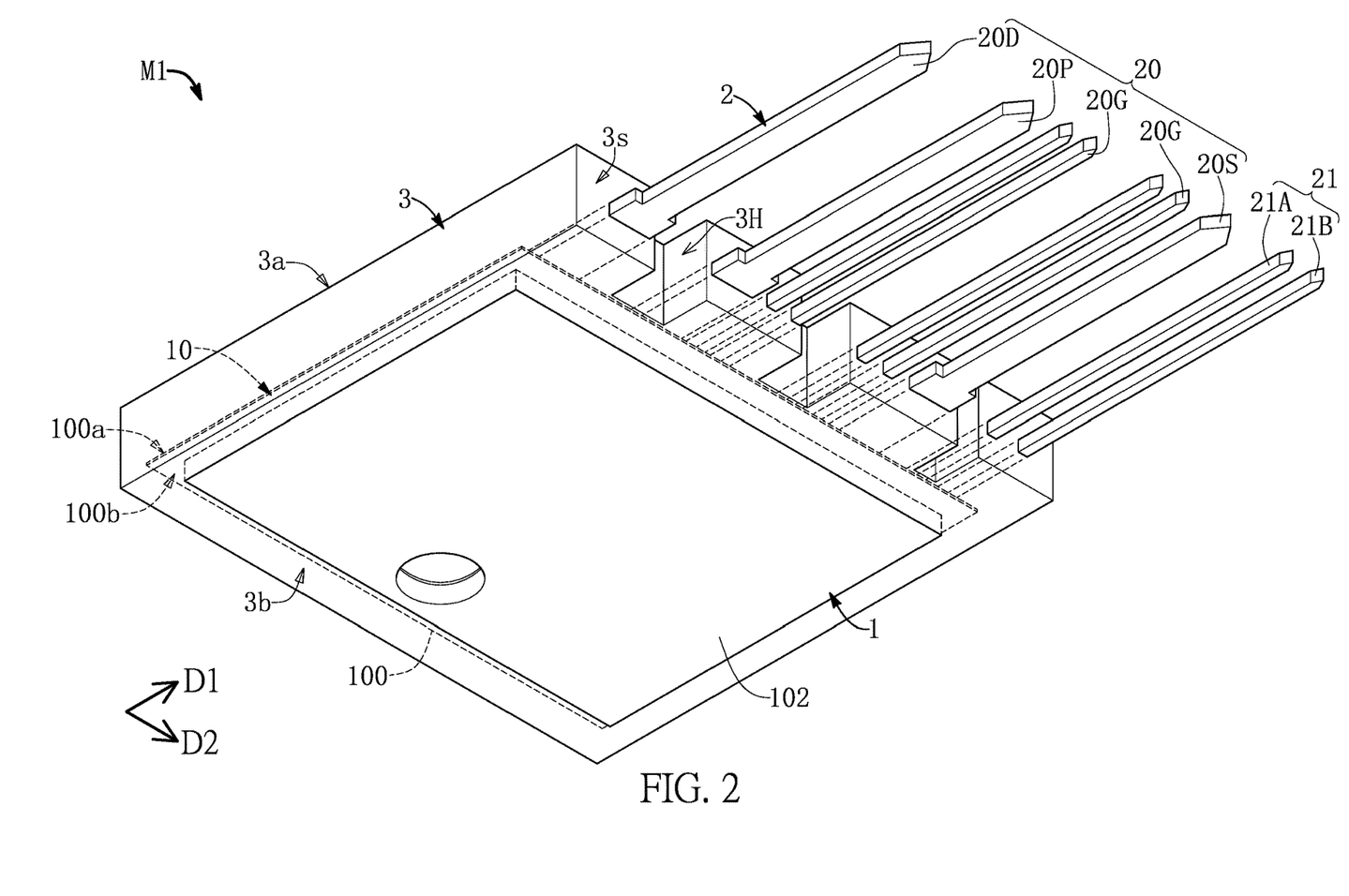
FIG. 2 is another schematic perspective view of the power module package according to the first embodiment of the present disclosure.

Referring to FIG. 1 to FIG. 2, FIG. 1 and FIG. 2 are schematic perspective views of a power module package (or a power package module) at different viewing angles according to the first embodiment of the present disclosure. The power module package M1 of this embodiment can be applied to a circuit design of electronic products, and is suitable for operating at high voltage and high current. In this embodiment, the power module package M1 includes an electronic assembly 1, a terminal assembly 2 and a package layer 3.

As shown in FIG. 1, the electronic assembly 1 of this embodiment includes a substrate 10 (such as a carrier board) and a power device group 11. In addition, the substrate 10 can not only carry the power device group 11, but can also establish electrical connections between a plurality of power devices of the power device group 11. In this embodiment, the detailed structure of the substrate 10 and the electrical connection relationship between the substrate 10 and the power device group 11 are described by taking a part of a circuit for forming a voltage conversion system circuit as an example.

Figure 3:
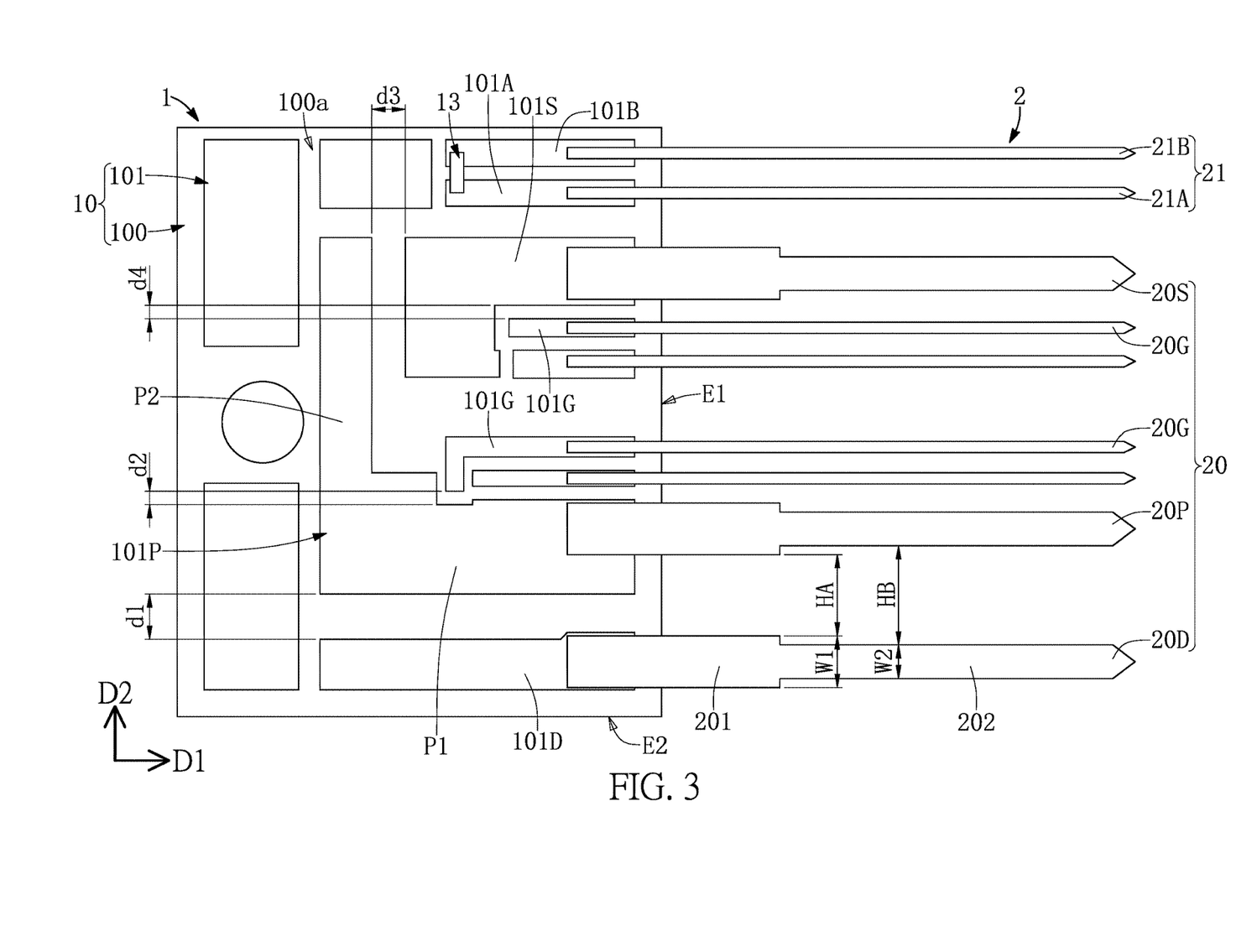
FIG. 3 is a schematic top view of a substrate and a terminal assembly according to the first embodiment of the present disclosure.
Figure 4:
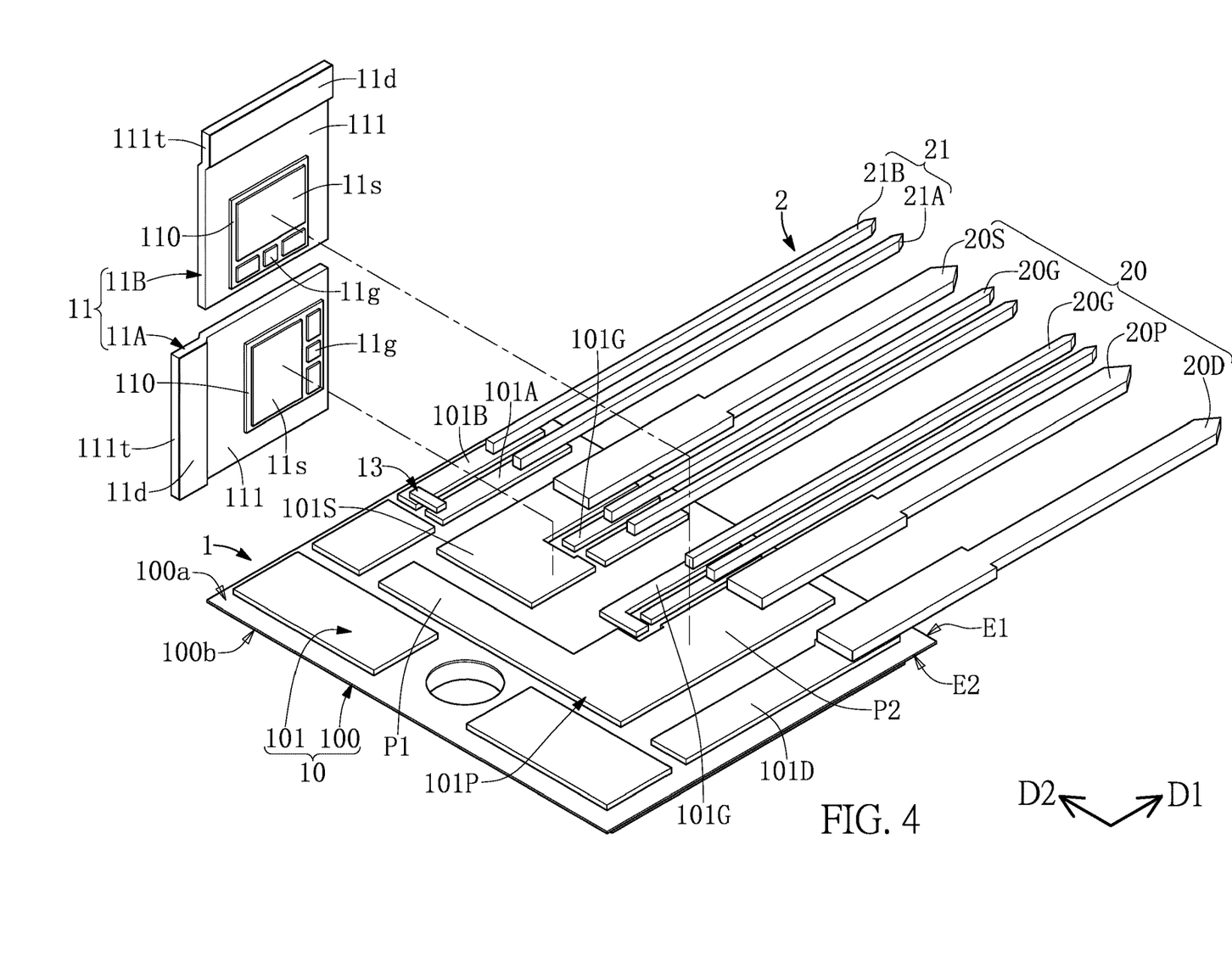
FIG. 4 is a schematic perspective exploded view of the power module package omitting a package layer according to the first embodiment of the present disclosure.

Referring to FIG. 1 to FIG. 4, FIG. 3 is a schematic top view of the substrate according to the first embodiment of the present disclosure, and FIG. 4 is a schematic exploded perspective view of the power module package omitting the package layer according to the first embodiment of the present disclosure. The substrate 10 includes an insulating layer 100, a circuit pattern layer 101 (such as a patterned wiring layer), and a conductive heat-dissipating layer 102.

The material of the insulating layer 100 may be ceramic, polymer or resin composite material, and the ceramic may be alumina, aluminum nitride or silicon nitride. The resin composite material may be epoxy resin or polyimide containing glass fiber cloth, but this example is not meant to limit the scope of the present disclosure. The insulating layer 100 has a first surface 100a and a second surface 100b opposite to each other.

As shown in FIG. 3, the circuit pattern layer 101 is disposed on the first surface 100a of the insulating layer 100. The circuit pattern layer 101 may include a plurality of bonding pads according to different requirements. Furthermore, the circuit pattern layer 101 can be used to construct the current transmission paths of the power devices (11A, 11B) of the power device group 11. Accordingly, the shape, number and configuration of the first bonding pads can be adjusted according to the number and the bonding positions of the power devices (11A, 11B) of the power device group 11.

In this embodiment, the circuit pattern layer 101 has a thickness greater than the thickness of the insulating layer 100 so as to allow a larger current to pass therethrough, so that the power module package M1 can operate under conditions of high voltage and high current. In one embodiment, the thickness of the circuit pattern layer 101 may range from 200 μm to 500 μm.

As shown in FIG. 3, the circuit pattern layer 101 of this embodiment may include a ground pad 101S, two gate pads 101G, a common pad 101P and a power input pad 101D, but this example is not meant to limit the scope of the present disclosure. It should be noted that, in this embodiment, the power module package M1 is an in-line power module package. Accordingly, a portion of the ground pad 101S, a portion of the gate pad 101G, a portion of the common pad 101P, and a portion of the power input pad 101D can extend toward the same side edge E1 of the insulating layer 100 (or the substrate 10), and an end of each of them is adjacent to the side edge E1 of the insulating layer 100, but this example is not meant to limit the scope of the present disclosure.

When the power module package M1 is operating, the ground pad 101S, the common pad 101P and the power input pad 101D should be able to allow a relatively large current to pass therethrough. Therefore, the area of any one of the ground pad 101S, the common pad 101P, and the power input pad 101D may be larger than that of each gate pad 101G.

Referring to FIG. 3, in this embodiment, the top view of the common pad 101P is shown as an L shape, and the common pad 101P has a first connection portion P1 extending along the first direction D1 and a second connection portion P2 extending along the second direction D2. In addition, by making the common pad 101P have an L shape, the area occupied by the circuit pattern layer 101 can be decreased, thereby further reducing the overall size of the power module package M1.

The first connection portion P1 extends toward the side edge E1 of the substrate 10 in the first direction D1, and is adjacent to the power input pad 101D. The first connection portion P1 and the power input pad 101D are separated from each other by a first distance d1. In addition, the first connection portion P1 and the adjacent gate pad 101G are separated from each other by a second distance d2, and the first distance d1 is greater than the second distance d2. By widening the first distance d1 between the first connection portion P1 and the power input pad 101D, arcing discharge can be avoided between the common pad 101P and the power input pad 101D, which may damage components.

The second connection portion P2 of the common pad 101P extends from one end of the first connection portion P1 to a position close to the ground pad 101S. In this embodiment, the second connection portion P2 of the common pad 101P and the ground pad 101S are separated from each other by a third distance d3, and the third distance d3 is also greater than a fourth distance d2 between the ground pad 101S and the another gate pad 101G so as to avoid arcing discharge between the common pad 101P and the ground pad 101S.

Referring to FIG. 2 again, in this embodiment, the conductive heat-dissipating layer 102 is disposed on the second surface 100b of the insulating layer 100. That is to say, the circuit pattern layer 101 and the conductive heat-dissipating layer 102 are respectively disposed on two opposite sides of the insulating layer 100.

In this embodiment, the total area of the conductive heat-dissipating layer 102 can be greater than the total area of the circuit pattern layer 101. In addition, in one embodiment, the conductive heat-dissipating layer 102 may be a thick metal plate, and the thickness of the conductive heat-dissipating layer 102 may be greater than the sum of the thickness of the insulating layer 100 and the thickness of the circuit pattern layer 101. For example, the thickness of the conductive heat-dissipating layer 102 can range from 800 µm to 1500 µm, and the thickness of the insulating layer 100 can range from 50 µm to 150 µm.

In addition, the material constituting the circuit pattern layer 101 can be selected from a material with high electrical conductivity, such as copper or its alloy so as to reduce parasitic resistance. The material constituting the conductive and heat-dissipating layer 102 can be mainly selected from materials with high thermal conductivity, such as copper, aluminum or their alloys so as to dissipate the heat generated from the power module package M1.

Figure 5:
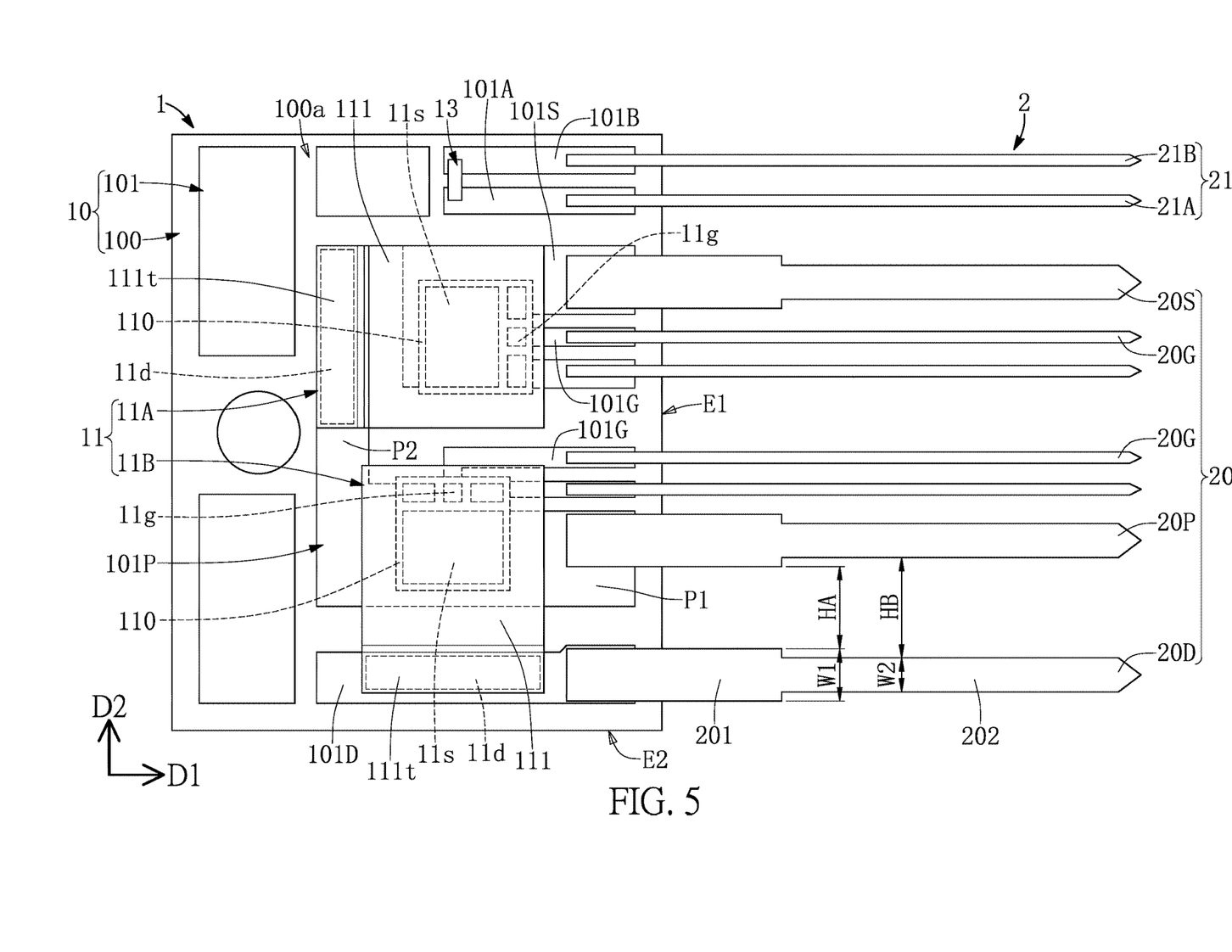
FIG. 5 is a schematic top view of the power module package omitting the package layer according to the first embodiment of the present disclosure.

Referring to FIG. 4 and FIG. 5, FIG. 4 is a schematic exploded perspective view of the power module package omitting the package layer according to the first embodiment of the present disclosure, and FIG. 5 is a schematic top view of the power module package omitting the package layer according to the first embodiment of the present disclosure. The power device group 11 is disposed on the substrate 10 and the circuit pattern layer 101.

It should be noted that universal circuits (or common circuits) are usually included in a variety of different system circuits (e.g., a voltage conversion circuit or a rectifier circuit), such as two power devices connected in series. Accordingly, the power module package M1 provided by the embodiment of the present disclosure is not a discrete component, but is a package module formed by a modular design. Furthermore, the power device group 11 and the circuit pattern layer 101 can jointly form a universal circuit, which can be used in various standardized system circuits.

In this embodiment, the power device group 11 may include a plurality of power devices (11A, 11B) (such as two power devices shown in FIG. 4 as an example), and the two power devices (11A, 11B) are electrically connected to the circuit pattern layer 101 in serial. When the power module package M1 is electrically connected to the external system circuit, the power devices (11A, 11B) can be electrically connected to other control components or passive components, but this example is not meant to limit the scope of the present disclosure.

The power device is, for example, an insulated gate bipolar transistor (IGBT), a metal-oxide-semiconductor field effect transistor (MOSFET) or any combination thereof. Materials of the power devices can be such as silicon carbide, silicon or gallium nitride.

Referring to FIG. 4 and FIG. 5, each of the power devices (11A, 11B) may include a source pad 11s, a drain pad 11d and a gate pad 11g. It is worth mentioning that the power devices (11A, 11B) of the present embodiment are pre-packaged components, and the drain pad 11d, the gate pad 11g and the source pad 11s are all located on the same side of the power devices (11A, 11B). Therefore, the power devices (11A, 11B) of the present embodiment can be directly disposed on the substrate 10 by the surface mounting technology (SMT) without using bonding wires, thereby reducing the overall volume of the power module package M1.

In detail, each of the power devices (11A, 11B) may include a power chip 110 and a conductive connecting element 111 connected to the power chip 110. The source pad 11s and the gate pad 11g are located on the active surface of the power chip 110. The conductive connecting element 111 is disposed on the backside of the power chip 110 and extends from the power chip 110 to the circuit pattern layer 101 on the substrate 10. Furthermore, the conductive connecting element 111 has a pin portion 111t, and the drain pad 11d is disposed at the end of the pin portion 111t.

As shown in FIG. 5, in this embodiment, the two power devices (11A, 11B) can be configured in different orientations. Furthermore, one of the power devices 11A is configured by using the power chip 110 to face toward the side edge E1 of the substrate 10. In other words, the power device 11A is configured to arrange the conductive connecting element 111 to extend in the first direction D1. The other power device 11B is configured by using the power chip 110 to face toward the power device 11A. That is to say, the pin portion 111t of the power device 11B is disposed toward the other side edge E2 of the substrate 10. In other words, the power device 11B is configured to arrange the conductive connecting element 111 to extend in the second direction D2.

As shown in FIG. 5, the two power devices (11A, 11B) can be connected in series through the circuit pattern layer 101. In detail, when the power devices (11A, 11B) are disposed on the circuit pattern layer 101, the two gate pads 11g of the two power devices (11A, 11B) can be connected to the two gate pads 101G, respectively. The source pad 11s of one of the power devices 11A is electrically connected to the ground pad 101S, and the drain pad 11d is electrically connected to the second connection portion P2 of the common pad 101P. The source pad 11s of the other power device 11B is electrically connected to the first connection portion P1 of the common pad 101P, and the drain pad 11d is electrically connected to the power input pad 101D.

Referring to FIG. 4 and FIG. 5 again, the electronic assembly 1 of this embodiment further includes at least one temperature sensor 13. In addition, the circuit pattern layer 101 further includes a positive electrode pad 101A and a negative electrode pad 101B. The two electrodes of the temperature sensor 13 can be electrically connected to the positive electrode pad 101A and the negative electrode pad 101B, respectively. In this embodiment, when the power device group 11 is operating, the temperature sensor 13 can be used to detect the temperature inside the power module package M1 so as to prevent the power devices (11A, 11B) from being damaged due to overheating. In one embodiment, the temperature sensor 13 may be a non-contact temperature sensor, such as a resistance temperature detector (RTD), but this example is not meant to limit the scope of the present disclosure.

Referring to FIG. 4, the terminal assembly 2 is disposed on the substrate 10 and connected to the circuit pattern layer 101, so that the temperature sensor 13 and the power devices (11A, 11B) can be electrically connected to another external circuit. Furthermore, the terminal assembly 2 may include a plurality of power device terminals 20. Each power device terminal 20 can be electrically connected to a corresponding one of the power devices (11A, 11B) through the circuit pattern layer 101.

The power device terminals 20 can be defined to receive or output a variety of different signals. For example, the power device terminals 20 may at least include a ground pin 20S, two gate pins 20G, a common pin 20P and a power input pin 20D, but this example is not meant to limit the scope of the present disclosure.

As shown in FIG. 4 and FIG. 5, the ground pin 20S is electrically connected to the ground pad 101S. The two gate pins 20G are respectively connected to the two gate pads

101G. In addition, the common pin 20P and the power input pin 20D are respectively connected to the common pad 101P and the power input pad 101D.

Accordingly, when the power device 11A is turned on and a voltage difference is applied to the ground pin 20S and the common pin 20P, the current can flow from the common pin 20P to the ground pin 20S through the power device 11A. In addition, when the power device 11B is turned on and a voltage difference is applied between the power input pin 20D and the common pin 20P, the current can flow from the power input pin 20D to the common pin 20P through the power device 11B.

It should be noted that, compared with other power device terminals (e.g., the gate pin 20G), the ground pin 20S, the common pin 20P and the power input pin 20D have a larger cross-sectional area to allow a relatively large current to pass therethrough. In addition, as shown in FIG. 5, in this embodiment, the spacing distances between two adjacent ones of the power device terminals 20 are not necessarily the same. In detail, two adjacent power device terminals 20 (e.g., the common pin 20P and the power input pin 20D) used for transmitting large currents can be set to have a larger separation distance.

In this embodiment, each of the power device terminals 20 is a straight terminal, but this example is not meant to limit the scope of the present disclosure. For example, in another embodiment, each power device terminal 20 may be a bending terminal. In yet another embodiment, the power device terminals 20 may include straight terminals and bending terminals.

In the embodiment of FIG. 5, a part of the power device terminals 20, such as the ground pin 20S, the common pin 20P and the power input pin 20D, has a connecting section 201 and an extending section 202 connected to each other. The connecting section 201 is directly connected to the circuit pattern layer 101 of the substrate 10, and the extending section 202 is not in contact with the substrate 10.

In this embodiment, the connecting section 201 and the extending section 202 have different widths, respectively. In detail, the connecting section 201 has a first width W1 in the second direction D2, and the extending section 202 has a second width W2 in the second direction D2. In this embodiment, the first width W1 is greater than the second width W2. Accordingly, for the two adjacent power input pins 20D and the common pin 20P, the shortest separation distance HA between the two adjacent connecting sections 201 is greater than the shortest separation distance HB between the two adjacent extending sections 202 distance, but this example is not meant to limit the scope of the present disclosure.

Since the first width W1 of the connecting sections 201 is larger so as to allow a larger current to pass through the connecting sections 201, but the shortest separation distance HA between two adjacent connecting sections 201 is also shortened. In one embodiment, according to the operating voltage of the power module package M1, the shortest separation distance HA can be adjusted to avoid arcing discharge.

In addition, as shown in FIG. 4 and FIG. 5, the terminal assembly 2 of this embodiment may further include a temperature sensing pin group 21, which is electrically connected to the temperature sensor 13 through the circuit pattern layer 101. The temperature sensing pin group 21 may include a positive electrode pin 21A and a negative electrode pin 21B respectively connected to the positive electrode pad 101A and the negative electrode pad 101B.

Figure 6:
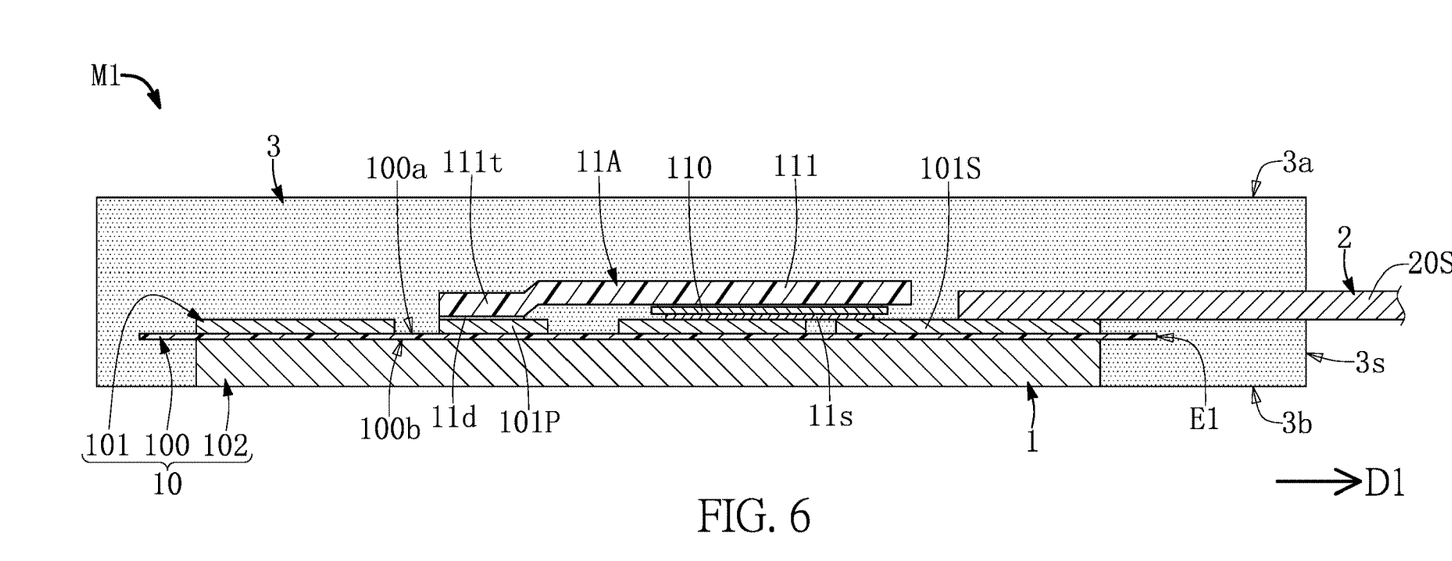
FIG. 6 is a schematic cross-sectional view taken along line VI-VI of FIG. 1.

Referring to FIG. 1, FIG. 2 and FIG. 6, the power module package M1 further includes a package layer 3, and the package layer 3 at least covers the electronic assembly 1. Since the power module package M1 of the present embodiment is an in-line power module package, a part of each of the power device terminals 20 protrudes from the same side surface 3s of the package layer 3 and is exposed outside the package layer 3.

When the power module package M1 is applied to another system circuit (not shown), by connecting the terminal assembly 2 of the power module package M1 and a corresponding voltage terminal, the power devices (11A, 11B) and other electronic components (e.g., the temperature sensor 13) of the power module package M1 are electrically connected to the system circuit.

Referring to FIG. 1 and FIG. 2 again, in this embodiment, the side surface 3s of the package layer 3 further has at least one recessed area 3H (such as two recessed areas shown as an example in FIG. 2). The at least one recessed area 3H can be located between two adjacent power device terminals 20 (e.g., the common pin 20P and the power input pin 20D) that need to receive a large current (e.g., allowing the large current to pass through the common pin 20P and the power input pin 20D), so that the creepage distance between the common pin 20P and the power input pin 20D can be increased. Referring to FIG. 1 and FIG. 2, it should be noted that the recessed region 3H in this embodiment extends from the top surface 3a of the package layer 3 to the bottom surface 3b of the package layer 3. In this way, current leakage between two adjacent power device terminals 20 can be avoided so as to prevent the product reliability from being decreased.

It is worth mentioning that, as shown in FIG. 6, the package layer 3 does not completely cover the conductive heat-dissipating layer 102. In other words, the outer surface of the conductive heat-dissipating layer 102 is exposed from the bottom surface 3b of the package layer 3 so as to quickly dissipate the heat generated by the operation of the power device group 11. In this embodiment, the outer surface of the conductive heat-dissipating layer 102 is flush with the bottom surface 3b of the package layer 3, but this example is not meant to limit the scope of the present disclosure. In another embodiment, the outer surface of the conductive heat-dissipating layer 102 can also protrude from the bottom surface 3b of the package layer 3 or be recessed relative to the bottom surface 3b of the package layer 3.

Referring to FIG. 6, a part of the package layer 3 can fill the gap between the power chip 110 and the conductive connecting element 111 of each of the power devices (11A, 11B), and fill the recess pattern that is defined by the circuit pattern layer 101, so that when the power module package M1 operates at a high voltage, the components can be prevented from being damaged by arcing discharge, thereby improving withstand voltage capability of the power module package M1.

Figure 7:
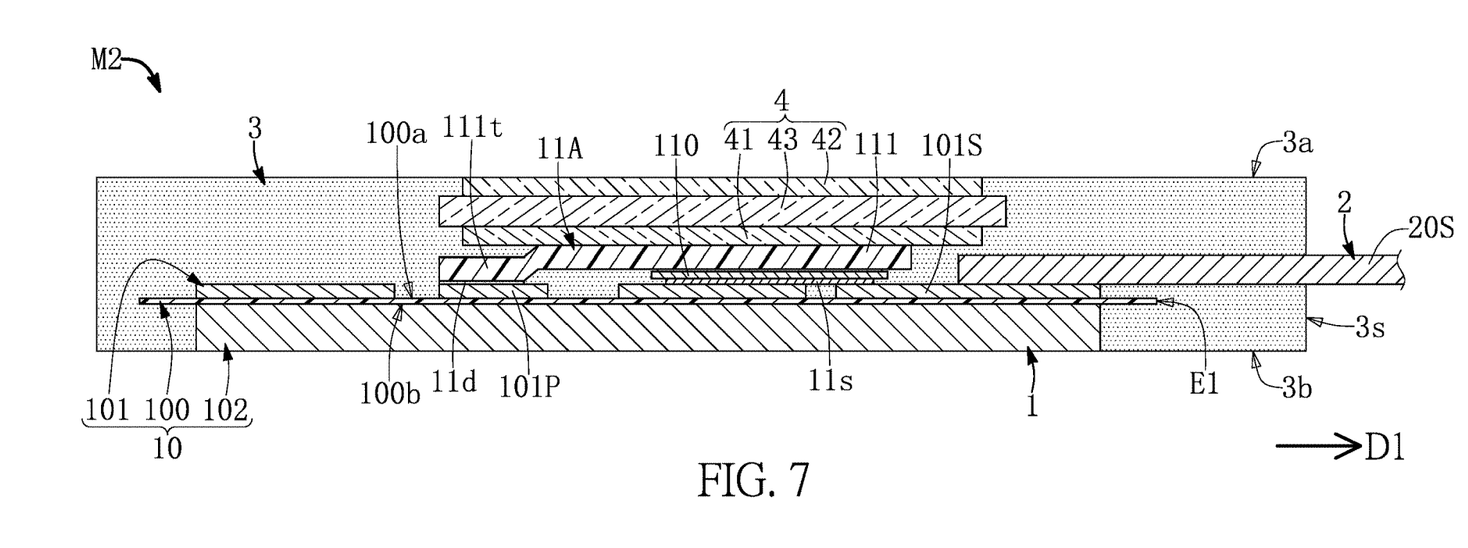
FIG. 7 is a schematic cross-sectional view of the power module package according to a second embodiment of the present disclosure.

Referring to FIG. 7, which is a partial schematic cross-sectional view of the power module package according to a second embodiment of the present disclosure. Components of this embodiment that are identical to those of the embodiment of FIG. 6 have the same or similar reference numerals, and will not be repeated. The power module package M2 of the present embodiment further includes a heat sink 4, and the heat sink 4 is located on the power device group 11 for dissipating the heat generated from the power devices (11A, 11B). That is to say, the heat sink 4 and the conductive heat-dissipating layer 102 are respectively located on two opposite sides of the substrate 10. Accordingly, the power devices (11A, 11B) are disposed between the heat sink 4 and the substrate 10.

In one embodiment, the heat sink 4 is, for example, a direct bonded copper (DBC) or direct plated copper (DPC) substrate, but this example is not meant to limit the scope of the present disclosure. As shown in FIG. 7, the heat sink 4 may include a first conductive layer 41, a second conductive layer 42, and an insulating heat conductor 43 located between the first conductive layer 41 and the second conductive layer 42. The first conductive layer 41 has two pads (not labeled) separate from each other, which are respectively disposed on the two power devices (11A, 11B). The insulating heat conductor 43 is, for example, a ceramic plate or an insulating glue material with a high thermal conductivity, but this example is not meant to limit the scope of the present disclosure. The second conductive layer 42 is disposed on the insulating heat conductor 43 and has an area larger than that of the first conductive layer 41.

In addition, the heat sink 4 is partially exposed outside the package layer 3. As shown in FIG. 6, the second conductive layer 42 of the heat sink 4 is exposed from the top surface 3a of the package layer 3, so that the heat generated by the operation of the power module package M2 can be more effectively dissipated to the outside.

Beneficial Effects of the Embodiments

One of the beneficial effects of the present disclosure is that the power module packages (M1, M2) provided by the present disclosure can reduce the volume of the power module packages (M1, M2), and can enable the power module packages (M1, M2) to have a higher operating voltage by virtue of the substrate 10 including the insulating layer 100, the circuit pattern layer 101 and the conductive heat-dissipating layer 102, the power device group 11 being arranged on the circuit pattern layer 101 to form the common circuit, the total area of the conductive heat-dissipating layer 102 being greater than the total area of the circuit pattern layer 101, and the thickness of the circuit pattern layer 101 being greater than the thickness of the insulating layer 100.

Furthermore, the present disclosure utilizes the circuit pattern layer 101 of the substrate 10 to replace the existing bonding wires as the current transmission paths of the power devices (11A, 11B). The power module packages (M1, M2) can omit the bonding wires, have a smaller volume, and allow a larger current to pass therethrough, thereby increasing the operating voltage of the power module packages (M1, M2). In addition, the conductive heat-dissipating layer 102 of the substrate 10 can also be used to dissipate the heat generated from the power module packages (M1, M2).

In addition, in the power module packages (M1, M2) of the embodiment of the present disclosure, the side surface 3s of the package layer 3 has a recessed area 3H, and the recessed area 3H is located between two adjacent power device terminals 20 (e.g., the common pin 20P and the power input pin 20D) that need to receive a large current, so that the creepage distance between the common pin 20P and the power input pin 20D can be increased. Therefore, current leakage between two adjacent power device terminals 20 can be avoided so as to improve product reliability and withstand voltage capability of the power module packages (M1, M2).

The power module packages (M1, M2) provided by the embodiments of the present disclosure are not discrete components, which are components that can be manufactured by modular design. However, different from the existing power module (which utilizes a plurality of different discrete components to form the entire normalized system circuit), the power module packages (M1, M2) of the present embodiment are a part of a universal circuit that forms a plurality of system circuits. Therefore, the power module packages (M1, M2) of the embodiment of the present disclosure can be applied to different standardized system circuits according to different requirements. Compared with the existing power modules, the power module packages (M1, M2) of the embodiments of the present disclosure may have greater applicability.

On the other hand, the temperature sensor 13 for detecting temperature can be arranged on the substrate 10 according to different requirements. When the power device group 11 is operating, the temperature sensor 13 can be used to detect the temperature inside the power module packages (M1, M2) so as to prevent the power devices (11A, 11B) from being damaged due to overheating.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power module package, comprising:
  an electronic assembly including:
    a substrate including an insulating layer, a circuit pattern layer and a conductive heat-dissipating layer, wherein the conductive heat-dissipating layer and the circuit pattern layer are respectively located on two opposite sides of the insulating layer; and
    a power device group disposed on the circuit pattern layer, wherein the power device group and the circuit pattern layer are configured to form a common circuit;
  wherein, a total area of the conductive heat-dissipating layer is greater than a total area of the circuit pattern layer, and a thickness of the circuit pattern layer is greater than a thickness of the insulating layer; and
  wherein the circuit pattern layer includes a ground pad, a common pad, and a power input pad, and a top view of the common pad is shown as an L shape, and the common pad includes a first connection portion and a second connection portion, the first connection portion extends toward a side edge of the substrate, and the second connection portion extends from the first connection portion to a position close to the grounding pad, and is separate from the grounding pad.

2. The power module package according to claim 1, wherein the electronic assembly further includes a temperature sensor disposed on the circuit pattern layer and is electrically connected to the circuit pattern layer.

3. The power module package according to claim 1, wherein a thickness of the conductive heat-dissipating layer is greater than the sum of the thickness of the circuit pattern layer and the thickness of the insulating layer.

4. The power module package according to claim 1, wherein the circuit pattern layer further includes two gate pads, the first connection portion and the power input pad are adjacent to each other and separated from each other by a first distance, the first connection portion is adjacent to one of the gate pads and separated from each other by a second distance, and the first distance is greater than the second distance.

5. The power module package according to claim 1, wherein the power device group includes two power devices, and each of the power devices includes a gate pad, a source pad, and a drain pad, and the source pad of one of the power devices and the drain pad of the other power device are both connected to the common pad.

6. The power module package according to claim 1, wherein the power device group includes two power devices, and the two power devices are connected with each other in series through the circuit pattern layer.

7. The power module package according to claim 6, wherein each of the power devices includes a power chip and a conductive connecting element, the conductive connecting element extends from a backside of the power chip to the substrate, one power device is configured to arrange the conductive connecting element of the one power device to extend in a first direction, another power device is configured to arrange the conductive connecting element of the another power device to extend in a second direction.

8. The power module package according to claim 1, further comprising a heat sink disposed on the electronic assembly, wherein the heat sink includes a first conductive layer, a second conductive layer and an insulating heat conductor located between the first conductive layer and the second conductive layer.

9. A power module package, comprising:
an electronic assembly including:
  a substrate including an insulating layer, a circuit pattern layer and a conductive heat-dissipating layer, wherein the conductive heat-dissipating layer and the circuit pattern layer are respectively located on two opposite sides of the insulating layer; and
  a power device group disposed on the circuit pattern layer, wherein the power device group and the circuit pattern layer are configured to form a common circuit;
a terminal assembly including a plurality of power device terminals, wherein each of the power device terminals is electrically connected to the power device group through the circuit pattern layer; and
a package layer enclosing the electronic assembly, wherein a part of each of the power device terminals protrudes from a side surface of the package layer and is exposed outside the package layer;
wherein, a total area of the conductive heat-dissipating layer is greater than a total area of the circuit pattern layer, and a thickness of the circuit pattern layer is greater than a thickness of the insulating layer; and
wherein the side surface of the package layer further has a recessed area, and the recessed area is located between two adjacent ones of the power device terminals and extends in a thickness direction of the package layer.

10. The power module package according to claim 9, wherein an outer surface of the conductive heat-dissipating layer is exposed from a bottom surface of the package layer.

* * * * *